United States Patent
Chang

(10) Patent No.: US 7,244,647 B2
(45) Date of Patent: Jul. 17, 2007

(54) EMBEDDED CAPACITOR STRUCTURE IN CIRCUIT BOARD AND METHOD FOR FABRICATING THE SAME

(75) Inventor: Ruei-Chih Chang, Hsin-chu (TW)

(73) Assignee: Phoenix Precision Technology Corporation, Hsin-Chu, Taiwan (CN)

( * ) Notice: Subject to any disclaimer, the term of this patent is extended or adjusted under 35 U.S.C. 154(b) by 66 days.

(21) Appl. No.: 11/264,999

(22) Filed: Nov. 1, 2005

(65) Prior Publication Data
US 2006/0063325 A1    Mar. 23, 2006

Related U.S. Application Data

(62) Division of application No. 10/739,371, filed on Dec. 17, 2003, now abandoned.

(30) Foreign Application Priority Data
Oct. 17, 2003    (TW) .............................. 92128802 A

(51) Int. Cl.
*H01L 21/8242* (2006.01)
(52) U.S. Cl. ...................... 438/239; 438/240; 438/241; 438/250; 438/253; 438/393; 438/396; 257/301; 257/E21.247

(58) Field of Classification Search .................... None
See application file for complete search history.

(56) References Cited

U.S. PATENT DOCUMENTS

| 6,967,138 B2* | 11/2005 | Ding ........................... 438/253 |
| 2005/0081349 A1* | 4/2005 | Chang ........................ 29/25.03 |

* cited by examiner

*Primary Examiner*—Michael Lebentritt
*Assistant Examiner*—Kyoung Lee
(74) *Attorney, Agent, or Firm*—Fulbright & Jaworski L.L.P.

(57) ABSTRACT

An embedded capacitor structure in a circuit board and a method for fabricating the same are proposed. The circuit board is formed with a first circuit layer on at least one surface thereof, wherein the first circuit layer has at least one first electrode plate for the capacitor structure. Then, a dielectric layer is formed on the first circuit layer and made flush with the first circuit layer. The dielectric layer has a relatively low dielectric constant and good fluidity to effectively fill the spaces between patterned traces of the first circuit later. A capacitive material is deposited on the dielectric layer and the first circuit layer. Finally, a second circuit layer is formed on the capacitive material and has at least one second electrode plate corresponding to the first electrode plate, together with the capacitive material disposed in-between, to form the capacitor structure.

9 Claims, 3 Drawing Sheets

EMBEDDED CAPACITOR STRUCTURE IN CIRCUIT BOARD AND METHOD FOR FABRICATING THE SAME

CROSS REFERENCE TO RELATED APPLICATION

This application is a divisional of application Ser. No. 10/739,371 filed Dec. 17, 2003 now abandoned and claims priority of Taiwan Application No. 092128802 filed Oct. 17, 2003.

FIELD OF THE INVENTION

This application is a divisional of application Ser. No. 10/739,371 filed Dec. 17, 2003 and claims priority of Taiwan Application No. 092128802 filed Oct. 17, 2003.

The present invention relates to embedded capacitor structures in circuit boards and methods for fabricating the same, and more particularly, to a film of capacitive material embedded in a semiconductor package substrate, and a method for forming the capacitor structure.

BACKGROUND OF THE INVENTION

In order to achieve desirable functionality and operating speed of electronic devices, semiconductor packages used therein are usually incorporated with passive components, such as resistors, capacitors and inductors, for enhancing and stabilizing performances of the electronic devices. The passive components are typically mounted on a surface of a circuit board such as printed circuit board or semiconductor package substrate, wherein the passive components can be located at corners of the substrate or outside a chip attach area on the substrate. However by this arrangement, the passive components not only occupy the surface area of the substrate but also adversely affect the trace routability on the substrate; besides, certain surface area of the substrate is reserved for bond pads, which thus limits the number of passive components capable of being mounted on the substrate, and is not favorable for development of highly integrated packages. Further, in the case of more passive components required for a performance-enhanced package, the substrate needs to be enlarged to accommodate the plurality of passive components and semiconductor chips, such that the package size would be significantly increased and not compliant with the trend of profile miniaturization.

Accordingly, there are developed embedded passive components in a substrate or circuit board which is sought to be thin, multi-layered and of high density by advanced lamination technology. FIG. 1 shows a conventional multi-layer circuit board 10 embedded with a film of capacitive material 11. The capacitive material 11 is a dielectric material having a high dielectric constant, such as polymers, ceramics, polymers with ceramic powders, and the like. In particular, the capacitive material 11 can be barium titanate, lead zirconate titanate or amorphous hydrogenated carbon, dispersed in a binder such as resin, glass powders, and so on. The film of capacitive material 11 can be formed by a sputtering, printing or roller coating process. The film of capacitive material 11 is sandwiched between two patterned circuit layers 12 each comprising several trace regions serving as electrode plates for capacitors, such that a plurality of capacitors can be formed and embedded in the circuit board 10.

The materials and methods for forming passive components such as resistors or capacitors in a laminated circuit board are well focused, and the critical aspect is how to embedded the passive components in the circuit board. Related prior arts include, for example, U.S. Pat. Nos. 3,857,683, 5,243,320, and 5,683,928; most of them are to form the passive components using a printing and/or photoresist-etching process on an organic insulating surface of a patterned circuit layer before forming a new laminated layer on the circuit board during its fabrication. However, when the capacitive material e.g. polymer is applied over the circuit layer, the polymeric material having poor fluidity can hardly effectively fill the spaces between adjacent traces of the circuit layer thereby leaving unfilled gaps, such that the thickness of the capacitive or polymeric material is not easily made even, making a subsequent circuit layer formed thereon not having good planarity. Those drawbacks not only degrade the electrical performance of a fabricated circuit board, but also affect the reliability of a subsequently formed build-up structure for a circuit board.

Therefore, the problem to be solved herein is to provide a capacitor structure embedded in a multi-layer substrate or circuit board, which eliminates the above drawbacks and thereby assures the electrical performance and reliability of the substrate or circuit board.

SUMMARY OF THE INVENTION

In view of the above, a primary objective of the present invention is to provide an embedded capacitor structure in a circuit board and a method for fabricating the same, which can assure planarity and reliability of the circuit board, increase the number of passive components incorporated in a semiconductor package using the circuit board, and improve trace routability on the circuit board.

In order to achieve the foregoing and other objectives, the method for fabricating an embedded capacitor structure in a circuit board proposed by the present invention comprises the steps of: providing the circuit board formed with a first circuit layer on at least one surface thereof, the first circuit layer comprising a plurality of patterned traces; forming a dielectric layer on the first circuit layer, and thinning the dielectric layer until the patterned traces are exposed; depositing a capacitive material on the dielectric layer and the first circuit layer; and forming a second circuit layer on the capacitive material, the second circuit layer comprising a plurality of patterned traces, wherein each of the first and second circuit layers further comprises at least one trace region serving as a electrode plate for the capacitor structure.

The embedded capacitor structure in the circuit board, which is fabricated by the above method, comprises a first circuit layer formed on the circuit board, the first circuit layer comprising a plurality of patterned traces and at least one first electrode plate for the capacitor structure; a dielectric layer formed on the circuit board and flush with the first circuit layer, wherein the dielectric layer fills spaces between the patterned traces; a capacitive material applied on the dielectric layer and the first circuit layer; and a second circuit layer formed on the capacitive material, and comprising at least one second electrode plate corresponding to the first electrode plate for the capacitor structure.

By the above embedded capacitor structure in a circuit board and the method for fabricating the same according to the invention, prior to applying a capacitive material over the circuit board, a dielectric layer is formed on and made flush with a first circuit layer patterned on the circuit board, wherein the first circuit layer has at least one first electrode plate for the capacitor structure. The dielectric layer is made of a material having a lower dielectric constant and better fluidity than those of the capacitive material, such that it can effectively fill the spaces between patterned traces of the first circuit layer without leaving unfilled gaps, which thereby assures the reliability of the circuit board and prevents delamination between laminated layers of the circuit board. The flush arrangement of the dielectric layer and the first circuit layer provides good planarity for subsequent build-up layers formed thereon. After the capacitive material is deposited on the dielectric layer and the first circuit layer, a second circuit layer is formed on the capacitive material and has at least one second electrode plate corresponding in position to the first electrode plate, together with the capacitive material disposed in-between, to form the capacitor structure embedded in the circuit board. The embedded arrangement of capacitor does not affect trace routability nor occupy area on the surface of the circuit board, thereby increasing flexibility of the number of capacitors capable of being incorporated in the circuit board and improving the trace routability on the circuit board.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFFERED EMBODIMENT

The preferred embodiment of the present invention is described in detail with reference to FIGS. 2A through 2F.

FIGS. 2A through 2F illustrates the steps of a method for fabricating an embedded capacitor structure in a circuit board 20 according to the invention.

Figure 1:
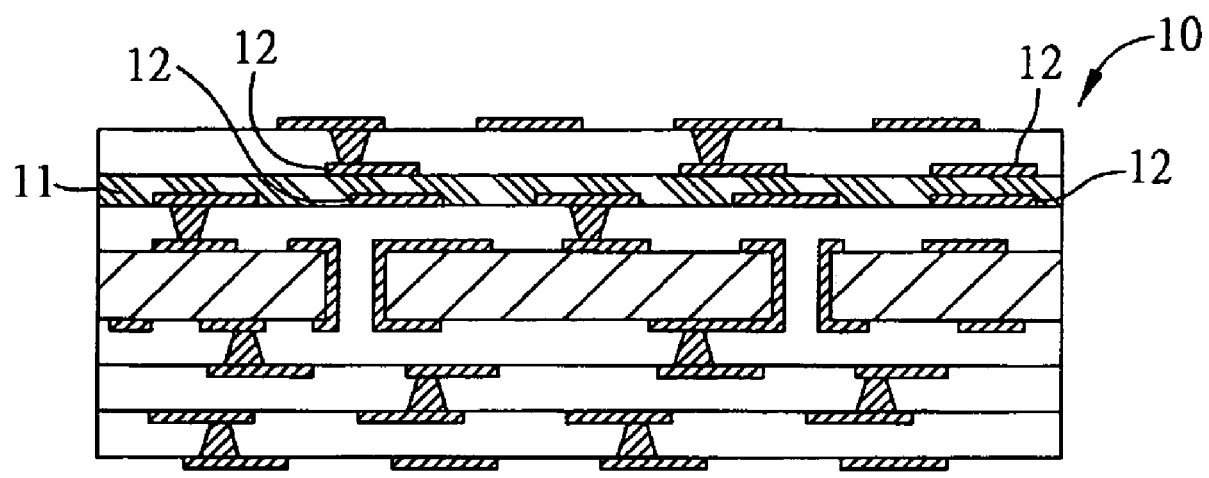
FIG. 1 (PRIOR ART) is a schematic cross-sectional view showing a conventional multi-layer circuit board incorporated with a capacitor structure therein.
Figure 2A:
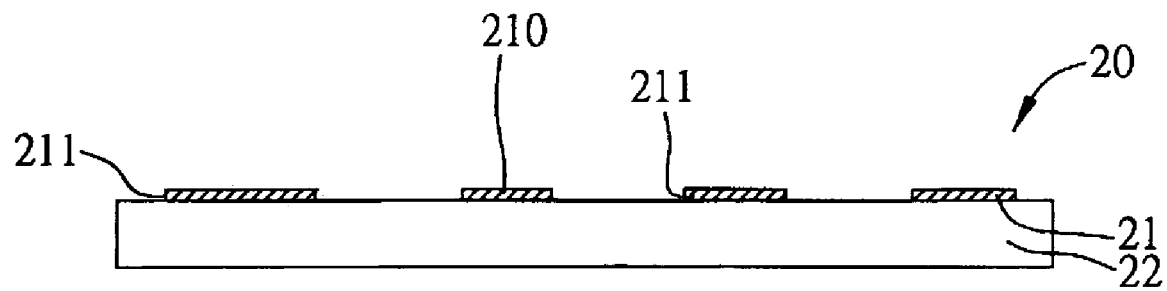
FIGS. 2A through 2F are schematic cross-sectional diagrams showing processing steps of a method for fabricating an embedded capacitor structure in a circuit board according to the present invention.

Referring to FIG. 2A, the first step is to provide the circuit board 20 formed with a first circuit layer 21 on at least one surface thereof, wherein the first circuit layer 21 comprises a plurality of patterned traces 210, and a plurality of trace regions serving as first electrode plates 211 for the capacitor structure. The circuit board 20 is primarily composed of an insulating layer 22 made of epoxy resin, polyimide resin, cyanate ester, glass fiber, BT (bismaleimide triazine) resin, a mixture of insulating organic materials (such as epoxy resin and glass fiber), or ceramics.

Figure 2B:
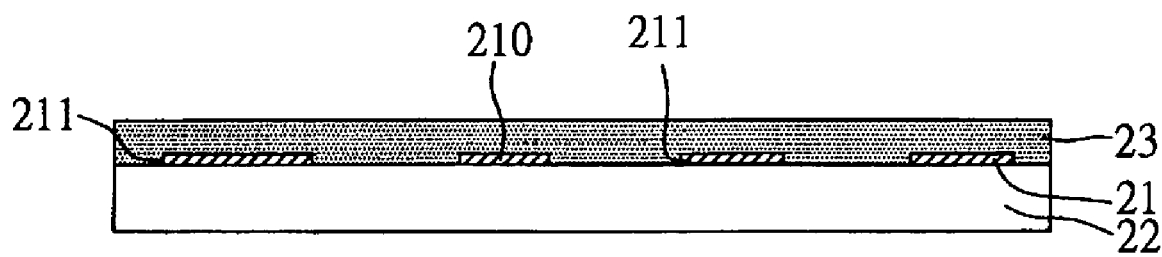

With reference to FIG. 2B, a dielectric layer 23 is formed on the insulating layer 22 and the first circuit layer 21. The dielectric layer 23 is made of a material having a relatively low dielectric constant and good fluidity, such as resin-based material e.g. ajinomoto build-up film (ABF).

Figure 2C:
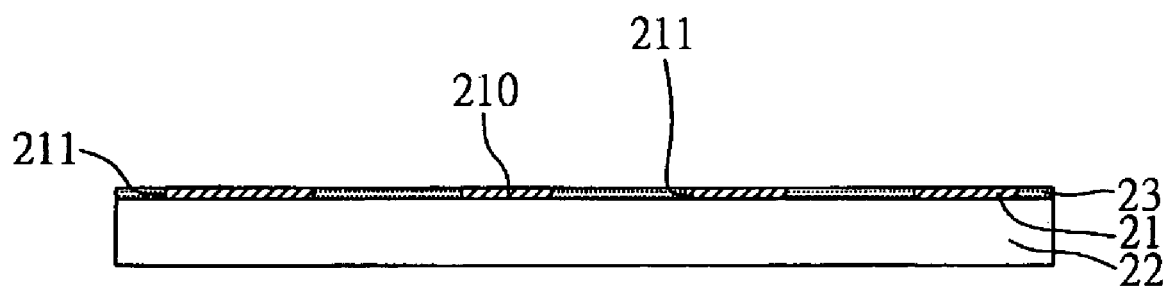

Referring to FIG. 2C, the dielectric layer 23 is thinned for example by a grinding process until the patterned traces 210 and the first electrode plates 211 are exposed, such that the dielectric layer 23 is flush with the first circuit layer 21. Since the dielectric layer 23 is made of a material having good fluidity, it can effective fill the spaces between the patterned traces 210 and between the first electrode plates 211. As a result, the patterned traces 210 and the first electrode plates 211 come into closely contact with the dielectric layer 23, thereby leaving unfilled gaps in-between.

Moreover, the flush arrangement of the dielectric layer 23 and the first circuit layer 21 provides good planarity for a subsequent build-up structure formed thereon.

Figure 2D:
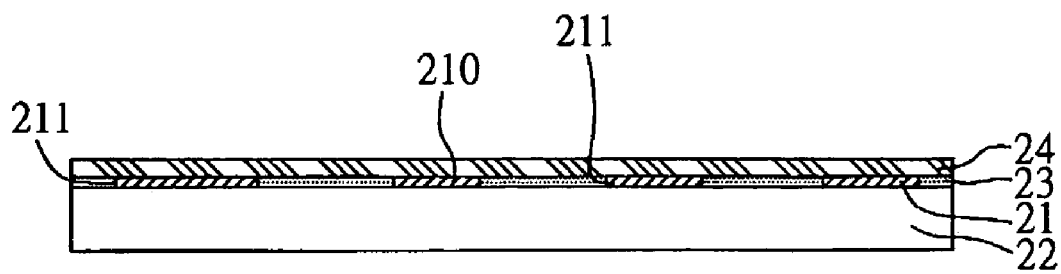
Figure 2D:
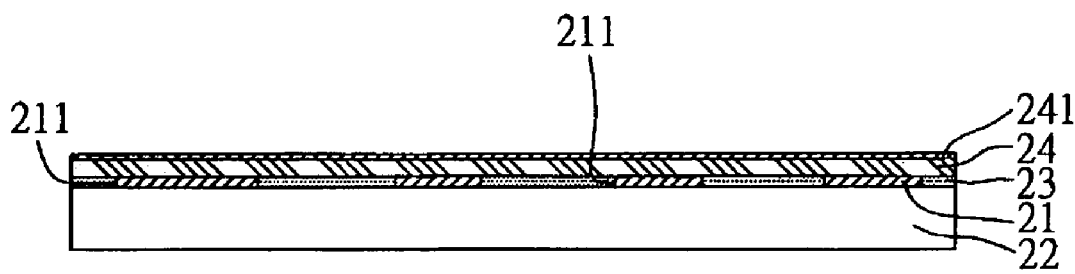

With reference to FIG. 2D, a film of capacitive material 24 is deposited onto the first circuit layer 21 and the dielectric layer 23 for example by a sputtering, printing or roller coating process. The capacitive material 24 has a higher dielectric constant than that of the dielectric layer 23. The capacitive material 24 is selected from the group consisting of polymers, ceramics, polymers with ceramic powders, and the like. In particular, the capacitive material 24 can be barium titanate, lead zirconate titanate or amorphous hydrogenated carbon, dispersed a binder such that resin, glass powders, and so on. With reference to FIG. 2D', a metal layer 241, such as copper, may optionally be formed on the capacitive material 24; alternatively, the capacitive material 24 may first be laminated with the metal layer 241, and then the capacitive material 24 with the metal layer 241 is deposited onto the first circuit layer 21 and the dielectric layer 23.

Figure 2E:
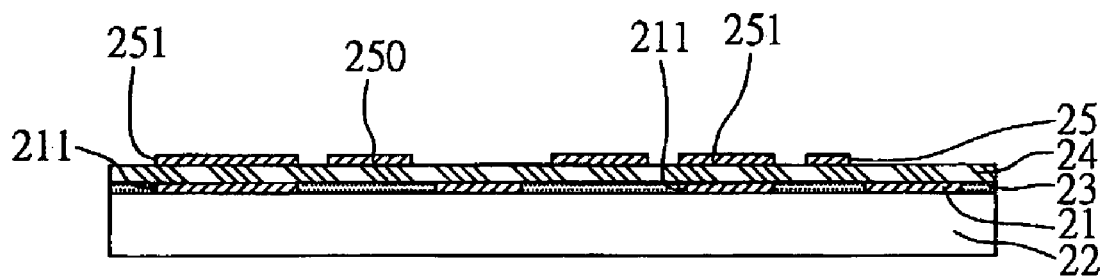

Referring to FIG. 2E, a second circuit layer 25 is formed on the capacitive material 24 or by patterning the metal layer 241 (FIG. 2D') if present. The second circuit layer 25 comprises a plurality of patterned traces 250 and a plurality of second electrode plates 251. The second electrode plates 251 are located corresponding to the first electrode plate 211, together with the capacitive material 24 disposed in-between, to form a plurality of capacitor structures. Capacitance of the capacitors is determined by capacitive composition and thickness of the capacitive material 24 used. Generally, the thinner the capacitive material 24, the higher the capacitance is.

Figure 2F:
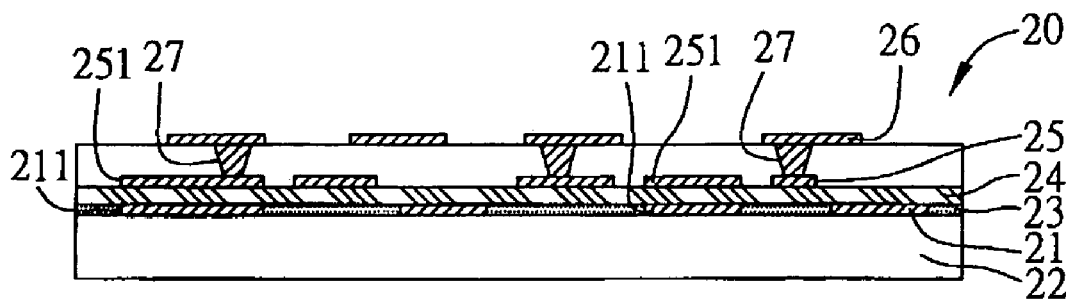

With reference to FIG. 2F, a build-up structure such as a third circuit layer 26 or another fabrication of capacitor structures (not shown) can be subsequently formed on the second circuit layer 25. The third circuit layer 26 are electrically connected to the second circuit layer 25 and the capacitor structures by a plurality of conductive vias 27. By the above processes, the circuit board 20 embedded with capacitor structures is fabricated; the circuit board 20 can be formed as a flip-chip package substrate, wire-bonded package substrate, or printed circuit board.

Therefore, the embedded capacitor structure in the circuit board 20, obtained by the above method according to the invention, comprises the first circuit layer 21 formed on the circuit board 20, the first circuit layer 21 comprising a plurality of patterned traces 210 and at least one first electrode plate 211 for the capacitor structure; the dielectric layer 23 formed on the circuit board 20 and flush with the first circuit layer 21, wherein the dielectric layer 23 fills spaces between the patterned traces 210; the capacitive material 24 deposited on the dielectric layer 23 and the first circuit layer 21; and the second circuit layer 25 formed on the capacitive material 24, and comprising at least one second electrode plate 251 corresponding to the first electrode plate 211 to form the capacitor structure.

In conclusion, by an embedded capacitor structure in a circuit board and a method for fabricating the same according to the invention, prior to applying a capacitive material over the circuit board, a dielectric layer is formed on and made flush with a first circuit layer patterned on the circuit board, wherein the first circuit layer has at least one first electrode plate for the capacitor structure. The dielectric layer is made of a material having a lower dielectric constant and better fluidity than those of the capacitive material, such that it can effectively fill the spaces between patterned traces of the first circuit layer without leaving unfilled gaps, which thereby assures the reliability of the circuit board and prevents delamination between laminated layers of the circuit board. The flush arrangement of the dielectric layer and the first circuit layer provides good planarity for subsequent build-up layers formed thereon. After the capacitive material is deposited on the dielectric layer and the first circuit layer, a second circuit layer is formed on the capacitive material and has at least one second electrode plate corresponding in position to the first electrode plate, together with the capacitive material disposed in-between, to form the capacitor structure embedded in the circuit board. The embedded arrangement of capacitor does not affect trace routability nor occupy area on the surface of the circuit board, thereby increasing flexibility of the number of capacitors capable of being incorporated in the circuit board and improving the trace routability on the circuit board.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating an embedded capacitor structure in a circuit board, comprising the steps of:
    providing the circuit board formed with a first circuit layer on at least one surface thereof, the first circuit layer comprising a plurality of patterned traces;
    forming a dielectric layer on the first circuit layer, and thinning the dielectric layer until the patterned traces are exposed;
    depositing a capacitive material on the dielectric layer and the first circuit layer; and
    forming a second circuit layer on the capacitive material, the second circuit layer comprising a plurality of patterned traces, wherein each of the first and second circuit layers further comprises at least one trace region serving as an electrode plate for the capacitor structure.

2. The method as recited in claim 1, further comprising: forming a build-up structure on the second circuit layer of the circuit board to form a multi-layer circuit board.

3. The method as recited in claim 2, wherein the build-up structure is embedded with at least one capacitor.

4. The method as recited in claim 1, wherein the circuit board is a flip-chip package substrate, wire-bonded package substrate, or printed circuit board.

5. The method as recited in claim 1, wherein the capacitive material is selected from the group consisting of polymers, ceramics, polymers with ceramic powders, and the like.

6. The method as recited in claim 1, wherein the capacitive material is selected from the group consisting of barium titanate, lead zirconate titanate and amorphous hydrogenated carbon, dispersed in a binder.

7. The method as recited in claim 1, wherein the capacitive material is deposited by a sputtering, printing, or roller coating process.

8. The method as recited in claim 1, wherein the dielectric layer is an ajinomoto build-up film (ABF).

9. The method as recited in claim 1, wherein the dielectric layer is made of a material having a lower dielectric constant than that of the capacitive material.

* * * * *